(12) United States Patent
Kurahashi et al.

(10) Patent No.: US 8,907,379 B2
(45) Date of Patent: Dec. 9, 2014

(54) SEMICONDUCTOR DEVICE WITH A GATE ELECTRODE HAVING A SHAPE FORMED BASED ON A SLOPE AND GATE LOWER OPENING AND METHOD OF MANUFACTURING THE SAME

(71) Applicant: Fujitsu Limited, Kawasaki-shi, Kanagawa (JP)

(72) Inventors: Naoko Kurahashi, Kawasaki (JP); Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/027,213

(22) Filed: Sep. 15, 2013

(65) Prior Publication Data

US 2014/0008701 A1   Jan. 9, 2014

Related U.S. Application Data

(62) Division of application No. 12/875,506, filed on Sep. 3, 2010, now Pat. No. 8,557,645.

(30) Foreign Application Priority Data

Sep. 7, 2009 (JP) ................. 2009-205756

(51) Int. Cl.
  *H01L 29/66* (2006.01)
  *H01L 29/423* (2006.01)
  *H01L 21/285* (2006.01)
  *H01L 29/778* (2006.01)
  *H01L 29/20* (2006.01)

(52) U.S. Cl.
  CPC .... *H01L 29/42372* (2013.01); *H01L 21/28587* (2013.01); *H01L 21/28593* (2013.01); *H01L 29/66462* (2013.01); *H01L 29/7783* (2013.01); *H01L 29/7787* (2013.01); *H01L 29/2003* (2013.01)
  USPC ....................................... 257/194

(58) Field of Classification Search
  CPC ................. H01L 21/28587; H01L 21/28593; H01L 29/42372; H01L 29/7783; H01L 29/7787; H01L 29/66462

USPC .......... 257/194, E21.026, E21.205, E21.208, 257/E21.45, E21.452; 438/182, 574, 712
See application file for complete search history.

(56) References Cited

U.S. PATENT DOCUMENTS 5,712,175 A   1/1998   Yoshida
6,180,528 B1  1/2001   Sasaki et al.
(Continued)

FOREIGN PATENT DOCUMENTS

JP   3-239331 A   10/1991
JP   3-268332 A   11/1991
(Continued)

OTHER PUBLICATIONS

USPTO, Notice of Allowance and Notice of Allowability, Jun. 17, 2013, in parent U.S. Appl. No. 12/875,506 [now allowed].
(Continued)

*Primary Examiner* — Stephen W Smoot
*Assistant Examiner* — Vicki B Booker
(74) *Attorney, Agent, or Firm* — Fujitsu Patent Center

(57) ABSTRACT

A semiconductor device has a semiconductor region including a gate electrode disposed over the semiconductor region, a first electrode portion, a second electrode portion standing substantially perpendicular to a surface of the semiconductor region and a substantially constant dimension in a direction parallel to the surface of the semiconductor region. The semiconductor device has a tapered portion disposed between the first electrode portion and the second electrode portion and has a dimension parallel to the surface of the semiconductor region increasing in the direction from the second electrode portion to the first electrode portion. Further, the semiconductor device includes a source and a drain electrode at both sides of the gate electrode over the semiconductor region and an insulating layer that covers a portion of the surface of the semiconductor region. Additionally, the second electrode portion may be positioned closer to one of the drain electrode and the source electrode.

9 Claims, 14 Drawing Sheets

(56) References Cited

U.S. PATENT DOCUMENTS

| | | | |
|---|---|---|---|
| 6,235,626 B1 | 5/2001 | Makino et al. | |
| 7,071,498 B2 * | 7/2006 | Johnson et al. | 257/192 |

FOREIGN PATENT DOCUMENTS

| | | |
|---|---|---|
| JP | 4-155933 A | 5/1992 |
| JP | 10-135239 A | 5/1998 |
| JP | 11-135522 A | 5/1999 |
| JP | 11-162995 A | 6/1999 |
| JP | 2000-58418 A | 2/2000 |
| JP | 2000-243758 A | 9/2000 |

OTHER PUBLICATIONS

USPTO, Non-Final Action, Nov. 19, 2012, in parent U.S. Appl. No. 12/875,506 [now allowed].

USPTO, Restriction Requirement, Jul. 18, 2012, in parent U.S. Appl. No. 12/875,506 [now allowed].

Japanese Office Action mailed Dec. 17, 2013 for corresponding Japanese Application No. 2009-205756, with Partial English-language Translation.

* cited by examiner

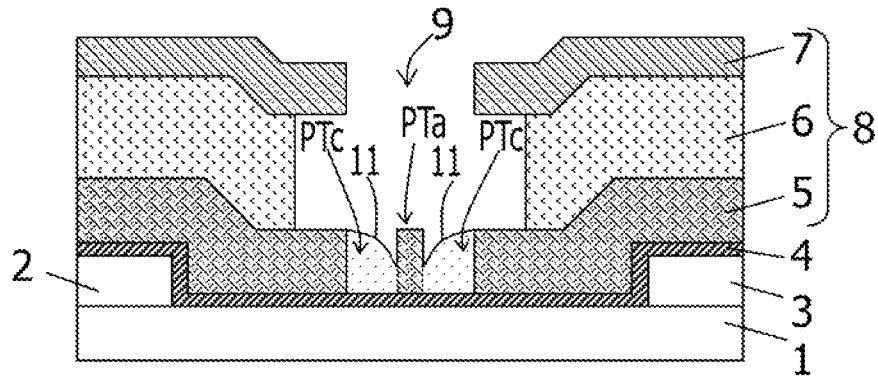
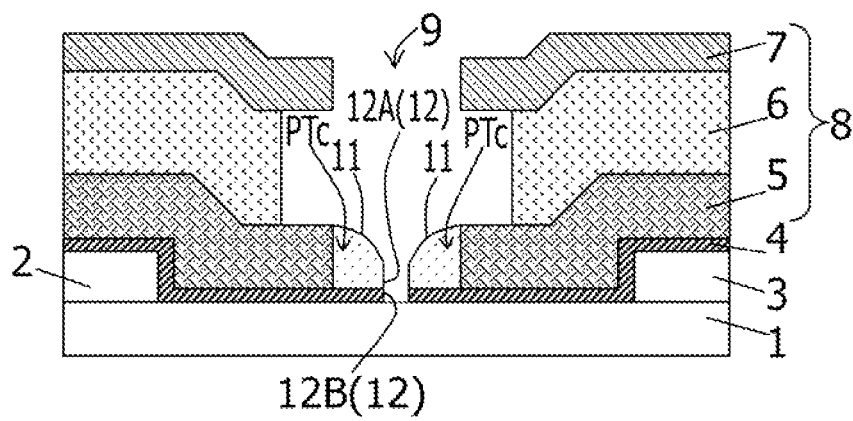
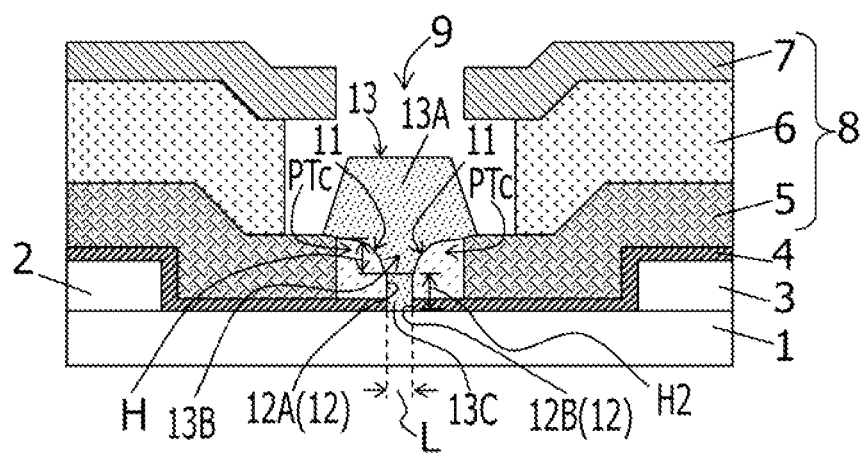

FIG. 9

| InGaAs | — 63 |
| InAlAs | — 62 |
| InGaAs | — 61 |
| InP | — 60 |

US 8,907,379 B2

SEMICONDUCTOR DEVICE WITH A GATE ELECTRODE HAVING A SHAPE FORMED BASED ON A SLOPE AND GATE LOWER OPENING AND METHOD OF MANUFACTURING THE SAME

CROSS-REFERENCE TO RELATED APPLICATION(S)

This application is a divisional of application Ser. No. 12/875,506 which has issued as U.S. Pat. No. 8,557,645, filed Sep. 3, 2010, which is based upon and claims the benefit of priority of the prior Japanese Patent Application No. 2009-205756, filed on Sep. 7, 2009, the entire contents of which are incorporated herein by reference.

FIELD

The embodiments discussed herein relate to a semiconductor device and a method of manufacturing the same.

BACKGROUND

In order to achieve high-frequency/high-power devices, such as a Gallium Nitride (GaN)-based high electron mobility transistor (HEMT), fine gate electrodes are desired. Also, a variety of research and development are progressing to prevent the increase in cost resulting from the reduction in yield rate caused by breakage in the gate electrode.

Gate electrodes of high frequency/high power devices typically have a T shape or a mushroom shape. The properties of the T-shaped or mushroom-shaped gate electrode can be enhanced by enlarging an upper electrode (gate upper portion) and thinning a lower electrode (gate lower portion).

However, the difference in size between the upper electrode and the lower electrode is increased by thinning the lower electrode. This makes it difficult to deposit a metal to form a gate electrode, and may cause breakage in the gate electrode.

In order to increase the yield rate, a gate electrode has been proposed which has a tapered shape between the upper electrode and the lower electrode.

For example, the following patent documents may be cited:
Japanese Unexamined Patent Application Publication Nos. 2000-58418 and 2000-243758.

SUMMARY

According to an aspect of the invention, a method of manufacturing a semiconductor device includes forming an insulating layer over a semiconductor region, the semiconductor region; forming a multilayer resist composite including a plurality of resist layers over the insulating layer; forming an opening in the resist layers of the multilayer resist composite except a lowermost resist layer; forming a reflow opening in the lowermost resist layer; reflowing part of the lowermost resist layer exposed in the reflow opening by heating to form a slope at the surface of the lowermost resist layer; forming a first gate opening in the lowermost resist layer so as to extend from the slope; and forming a gate electrode having a shape depending on the shapes of the opening in the multilayer resist composite, the slope and the first gate lower opening.

According to another aspect of the invention, a semiconductor device includes a semiconductor region; a gate electrode disposed over the semiconductor region, including a first electrode portion, a second electrode portion standing substantially perpendicular to a surface of the semiconductor region and having a substantially constant dimension in a direction parallel to the surface of the semiconductor region, and a tapered portion disposed between the first electrode portion and the second electrode portion and having a dimension parallel to the surface of the semiconductor region increasing in the direction from the second electrode portion to the first electrode portion; and an insulating layer covering at least a portion of the surface of the semiconductor region.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A to 1F are schematic sectional views showing an exemplary method of manufacturing a semiconductor device and the semiconductor device according to a first embodiment of the present invention;

FIG. 9 is a schematic sectional view of an exemplary semiconductor region of a semiconductor device according to still another aspect of the embodiments.

DESCRIPTION OF EMBODIMENTS

Figure 1A:
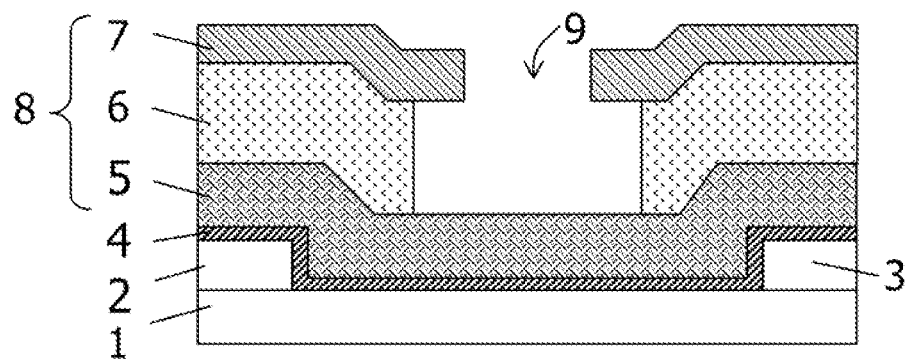

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present. Like reference numerals refer to like elements throughout.

If the lower electrode of, for example, a T-shaped gate electrode having a tapered portion is thinned, the gate electrode may be broken or the lower electrode may fail to be formed. Accordingly, it is difficult to form a desired fine gate in, for example, a T-shaped gate electrode having a tapered portion.

More specifically, if the lower electrode is thinned, the joint with the upper electrode is thinned accordingly and the tapered portion becomes steep. In this instance, the side wall of the resist layer for forming the tapered portion is steeply slanted because of a step of vapor-depositing a metal to form the gate electrode. This makes it difficult to deposit a metal favorably and may cause a problem. For example, a cavity may be formed in the gate electrode that causes the breakage of the gate electrode. The breakage of the gate electrode reduces the yield rate and increases the cost.

In order to form a tapered shape, a gate lower opening for forming the gate lower portion is formed in a resist layer, and the side wall of the opening in the resist layer is heated to deform the resist, thus forming a slope at the side wall of the resist layer. However, if the slope of the side wall in the resist layer is formed at a gentle inclination to form a gentle taper so as to prevent the breakage of the gate electrode caused by thinning the lower electrode, the gate lower opening is undesirably filled with the reflowed resist. Consequently, a good, thin gate lower opening cannot be formed. Hence, the lower electrode cannot be formed and a fine gate fails to be formed.

A semiconductor device and its manufacturing method according to a first embodiment will now be described with reference to FIGS. 1A to 1F, 2A, and 2B.

The semiconductor device according to the present embodiment is, for example, a high-frequency, high-power device such as a GaN-based HEMT.

The method of manufacturing the semiconductor device of the present embodiment, mainly a process for forming a gate electrode, will be described with reference to FIGS. 1A to 1F.

As shown in FIG. 1A, a source electrode 2 and a drain electrode 3 are formed as ohmic electrodes on a semiconductor region 1 formed on a semiconductor substrate.

Figure 2A:
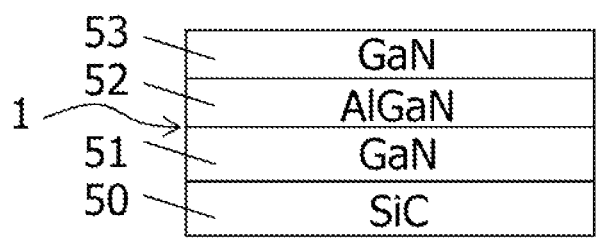
FIGS. 2A and 2B are schematic sectional views of an exemplary semiconductor region of the semiconductor device of the first embodiment.
Figure 2B:
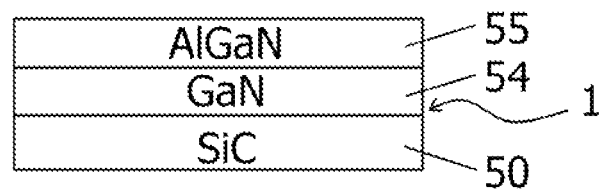

As shown in FIGS. 2A and 2B, the semiconductor substrate (compound semiconductor substrate) may be, for example, a Silicon Carbide (SiC) substrate 50. The semiconductor region (compound semiconductor region) 1 has a multilayer structure on the SiC substrate 50. For example, the multilayer structure may include, but is not limited to, a GaN layer 51, an AlGaN layer 52 and a GaN layer 53, or a GaN layer 54 and an AlGaN layer 55.

An insulating layer (for example, a silicon nitride film) 4 is formed over a surface of the semiconductor region 1 having the source electrode 2 and the drain electrode 3 thereon by, for example, chemical vapor deposition (CVD), as shown in FIG. 1A.

Subsequently, a plurality of resist layers 5, 6 and 7 are deposited to form a multilayer resist composite (multilayer resist film) 8 on the insulating layer 4. The multilayer resist composite 8 used in the present embodiment may include at least an electron resist layer as a lowermost resist layer 5. For example, a polymethyl methacrylate (PMMA)-based resist layer can be used as the electron resist layer 5.

An opening 9 is formed in resist layers 6 and 7 of the multilayer resist composite 8, as shown in FIG. 1A. Thus an overhang structure through which an upper electrode (overgate portion, gate upper portion) 13A of a mushroom-shaped gate electrode 13 (see FIG. 1F) is formed on the electron resist layer 5.

Figure 1B:
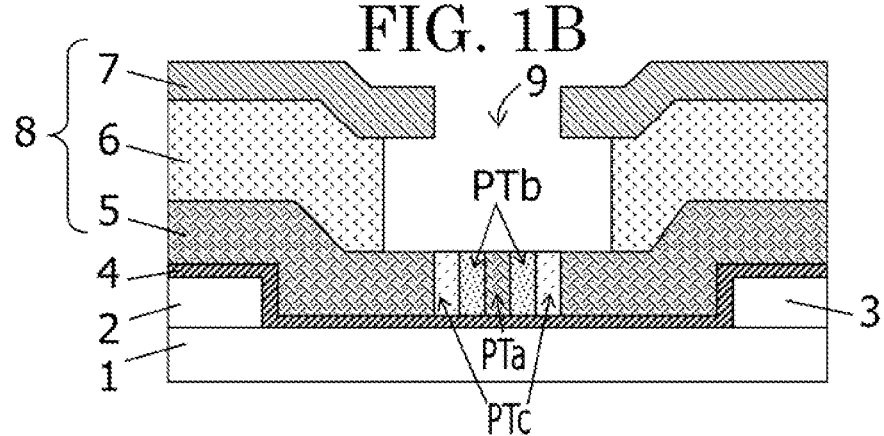
Figure 1C:
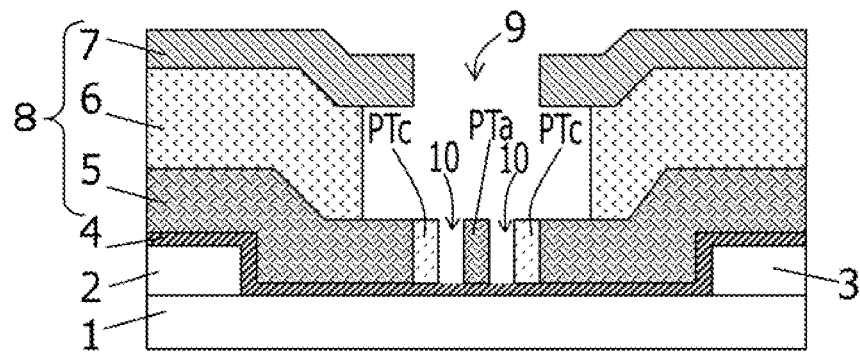

Turning to FIGS. 1B and 1C, reflow openings 10 are formed in the electron resist layer 5 (resist layer in which a lower electrode is to be formed).

As shown in FIGS. 1B and 1C, first regions PTb of the electron resist layer 5, in which the reflow openings 10 are to be formed, are exposed to an electron beam at a dose higher than second regions PTc adjacent to the first regions PTb. The first regions PTb are then selectively removed to form the reflow openings 10 in the electron resist layer 5 by, for example, development. In the present embodiment, the first regions PTb and the second regions PTc are substantially simultaneously exposed to an electron beam at different doses. This can reduce the number of process steps. The first regions PTb may be referred to as the reflow regions. The second regions PTc may be referred to as the tapering resist regions.

As shown in FIG. 1B, the first regions PTb are formed on both sides of a third region PTa of the electron resist layer 5, in which an opening 12A (part of gate lower opening 12) is to be formed, in such a manner that the third regions PTa are disposed between the first regions PTb. Also, the second regions PTc are formed on two sides of the first regions PTb and the third region PTa in such a manner that the first regions PTb and the third region PTa are disposed between the second regions PTc.

Layout data of patterns for a gate thin portion, the reflow region and the tapering region prepared by, for example, a computer aided design (CAD) system is suggested for the gate portion in a mask layout for forming a transistor. The pattern for the gate thin portion may be referred to as a lower electrode pattern or pattern A. The pattern for the reflow region adjacent to pattern A may be referred to as pattern B. The pattern for the tapering region adjacent to pattern B may be referred to as pattern C.

More specifically, the second regions PTc and the first regions PTb adjoining the inner sides of the second regions PTc may be simultaneously exposed at respective doses: a low dose (for example, about 120 $\mu C/cm^2$) for the second regions PTc; and a high dose (for example, about 600 $\mu C/cm^2$) for the first regions PTb, without exposing the third region PTa. The second regions PTc may be exposed to an electron beam using pattern C data, and the first regions PTb may be exposed to an electron beam using pattern B data.

Then, the first regions PTb, which have been exposed at a high dose, may be selectively removed to form the reflow openings 10 by development, as shown in FIG. 1C. In this instance, only the first regions PTb are removed to form the openings. The second regions PTc have been exposed to an electron beam, but are not removed, and the third region PTa, which has not been exposed, remains.

The high dose for the first regions PTb is set for selectively removing the first regions PTb. The low dose for the second regions PTc is set for defining the region to be reflowed. In other words, by exposing the second regions PTc to an electron beam at a low dose, the regions to be reflowed are divided from the other regions.

In order to remove selectively the first regions PTb, a low-solubility developer, such as a mixture (MIBK IPA) of methyl isobutyl ketone (MIBK) and isopropanol (IPA), can be used.

Turning to FIG. 1D, part of the electron resist layer 5, that is, the second regions PTc (side walls of the electron resist layer 5 exposed in the reflow openings 10), are heated to reflow. Thus slopes 11 are formed at the side walls of the electron resist layer 5 for forming a tapered portion 13B (see FIG. 1F) of the gate electrode 13.

Then, an opening 12A is formed in the electron resist layer 5 so as to extend from the slopes 11 at the surface of the electron resist layer 5 by reflowing, as shown in FIG. 1E.

More specifically, after the second regions PTc are reflowed, the third region PTa, in which the lower electrode (gate lower portion, gate thin portion, or base) 13C of the gate electrode 13 is to be formed, is exposed to an electron beam and is then removed by, for example, development. Thus the opening 12A is formed in the electron resist layer 5. The lower electrode 13C may be referred to as the thin gate portion or gate thin portion.

Specifically, the third region PTa is exposed to an electron beam at a high dose (for example, about 600 μC/cm$^2$) and is removed to form the opening 12A in the electron resist layer 5 by, for example, development. The third region PTa may be exposed to an electron beam using the above-mentioned pattern A data.

After the opening 12A is formed in the electron resist layer 5, the insulating layer 4 is etched (for example, dry etching) to form an opening 12B in the insulating layer 4, as shown in FIG. 1E, using the electron resist layer 5 having the opening 12A as a mask.

The opening 12A in the electron resist layer 5 and the opening 12B in the insulating layer 4 define a gate lower opening (gate thin opening) 12 in which the lower electrode 13C of the gate electrode 13 is to be formed. Therefore the opening 12A in the electron resist layer 5 and the opening 12B in the insulating layer 4 may be referred to as the first gate lower opening and the second gate lower opening, respectively.

Thus the thickness of the electron resist layer 5 (second regions PTc) allows a substantially vertical opening to be formed from the bottom of the gate lower opening 12 (from the surface of the semiconductor region 1) to a desired height.

Turning to FIG. 1F, a gate electrode 13 is formed in a shape according to the shape of the opening 9 in the multilayer resist composite 8, the slopes 11 and the gate lower opening 12.

More specifically, a metal may be vapor-deposited in the opening 9 of the multilayer resist composite 8, including the regions on the slopes 11 and in the gate lower opening 12, and then the multilayer resist composite 8 is removed. Thus the metal deposited along the shape of the resist layers may form a mushroom-shaped gate electrode 13.

In the present embodiment, part (second regions PTc) of the electron resist layer 5 exposed in the reflow opening 10 are heated to reflow, and then the gate lower opening 12 is formed in the electron resist layer 5, as described above.

Consequently, the tapered portion 13B of the gate electrode 13 can have a gentler inclination than that of known gate electrodes. In addition, a substantially vertical thin gate lower opening 12 can be formed in the electron resist layer 5 as desired without being filled with the reflowed electron resist layer 5.

In the structure, the semiconductor device of the present embodiment includes the semiconductor region 1, the gate electrode 13, the source electrode 2, the drain electrode 3, and the insulating layer 4 covering the surface of the semiconductor region 1, as shown in FIG. 1F.

The gate electrode 13 is disposed over the semiconductor region 1 and includes the upper electrode (gate upper portion) 13A, the lower electrode (gate lower portion, gate thin portion, or first base) 13C, and the tapered portion (second base) 13B between the upper electrode 13A and the lower electrode 13C. The gate electrode 13 is in a mushroom shape.

The source electrode 2 and the drain electrode 3 are disposed on the semiconductor region 1 with the gate electrode 13 therebetween.

In the present embodiment, the lower electrode 13C of the gate electrode 13 stands perpendicular to the surface of the semiconductor region 1, and has substantially constant dimensions in the directions parallel to the surface of the semiconductor region 1.

The tapered portion 13B of the gate electrode 13 is in a forward tapered shape having dimensions parallel to the surface of the semiconductor region 1 gradually increasing in the direction from the lower electrode 13C to the upper electrode 13A.

The upper electrode 13A of the gate electrode 13 rises from the end of the tapered portion 13B so as to spread over the tapered portion 13B.

The gate electrode 13 is thus disposed on the semiconductor region 1 with the sides of the lower electrode 13C in contact with the insulating layer 4. The lower electrode 13C rises substantially vertically beyond the level of the surface of the insulating layer 4.

The insulating layer 4 is disposed so as to substantially cover the surface of the semiconductor region 1 exposed between the source electrode 2 and the drain electrode 3, that is, between the gate electrode 13 and the source electrode 2 and between the gate electrode 13 and the drain electrode 3. The insulating layer 4 also covers the sides and surfaces of the source electrode 2 and the drain electrode 3.

The insulating layer 4 can be made of, for example, an oxide, a nitride, or a High-k dielectric (high-permittivity material). For example, the material of the insulating layer 4 can be selected from the group consisting of $SiO_2$, SiN, HfSiO, HfAlON, $HfO_2$, and $Y_2O_3$.

Preferably, a dimension of the lower electrode 13C parallel to the surface of the semiconductor region 1 (width L of the lower electrode 13C) and the length of the tapered portion 13B perpendicular to the surface of the semiconductor region 1 (height H of the tapered portion 13B) have an aspect ratio satisfying the relationship H/L≤2.75. In this instance, the tapered portion 13B has an inclination of about 70° or less with respect to the direction parallel to the surface of the semiconductor region 1.

If the width L of the lower electrode 13C is about 100 nm or less, the length of the lower electrode 13C perpendicular to the surface of the semiconductor region 1 (height H2 of the lower electrode 13C) and the width L of the lower electrode 13C preferably have an aspect ratio satisfying the relationship H2/L≥1.0.

In the semiconductor device and its manufacturing method according to the present embodiment, the tapered portion 13B of the gate electrode 13 has a gentle inclination. Consequently, the lower electrode 13C can be formed more thinly while possible breakage of the gate electrode 13 is reduced.

Hence, the resulting gate structure has the tapered portion 13B having a gentler inclination from the thin lower electrode 13C to the upper electrode 13A. Accordingly, cavities are not easily formed in the joint of the lower electrode 13C and the upper electrode 13A, and the possible breakage of the gate electrode 13 can be reduced. Consequently, the yield rate can be increased to reduce the cost.

Furthermore, since the present embodiment can achieve a finer gate structure, high-frequency/high-power characteristics can be enhanced.

Since the thin lower electrode 13C can be formed substantially vertically to a desired height, the volume of the portion of the gate electrode 13 under the bottom of the upper electrode 13A (portion defined by the tapered portion 13B and the lower electrode 13C) can be reduced to reduce the gate resistance according to the use of the device. For example, the resistance and dimensions of the gate can be reduced in high-frequency/high-power devices, such as a GaN-based HEMT.

A semiconductor device and its manufacturing method according to a second embodiment will now be described with reference to FIGS. 3A to 3F.

The semiconductor device manufacturing method of the present embodiment is different from that of the first embodiment shown in FIGS. 1A to 1F in the step of exposing and developing the lowermost resist layer of the multilayer resist composite in which the gate electrode is to be formed.

In FIGS. 3A to 3F, the same parts as in the first embodiment shown in FIGS. 1A to 1F are designated by the same reference numerals.

Figure 3A:
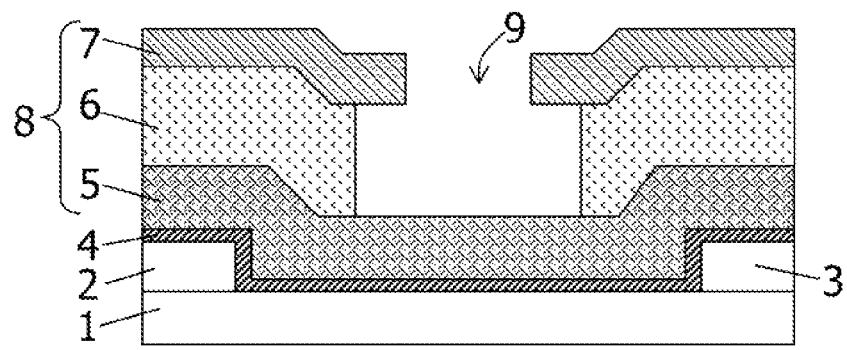
FIGS. 3A to 3F are schematic sectional views showing an exemplary method of manufacturing a semiconductor device and the semiconductor device according to a second embodiment of the present invention.

As shown in FIG. 3A, the steps until an opening 9 is formed in resist layers 6 and 7 of the multilayer resist composite 8 other than the lowermost resist layer may be performed in a similar manner as in the first embodiment (see FIG. 1A).

Figure 3B:
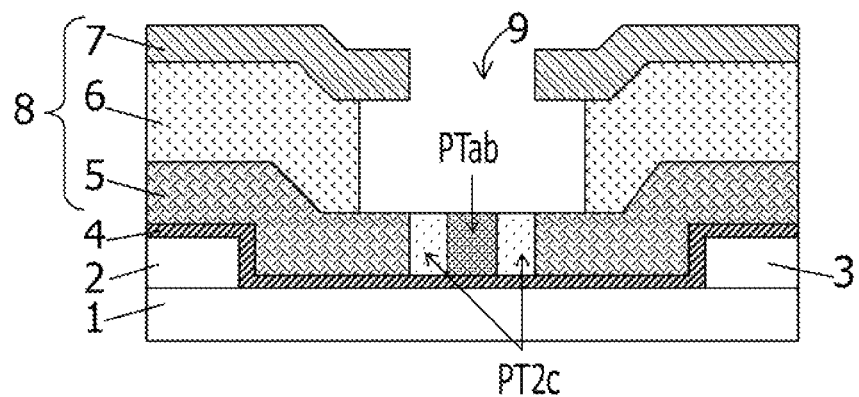
Figure 3C:
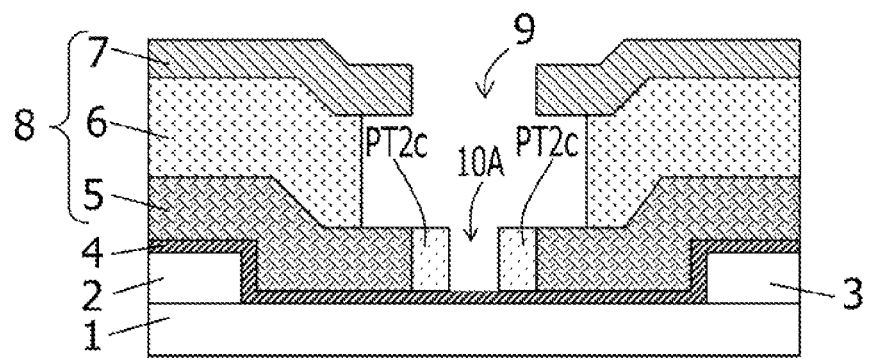

Turning to FIGS. 3B and 3C, a reflow opening 10A is formed in the lowermost electron resist layer 5 (resist layer in which a lower electrode is to be formed).

In the present embodiment, a first region PTab of the electron resist layer 5 is set so as to include a third region PT2a (see FIG. 3D) of the electron resist layer 5. More specifically, the first region PTab, in which the reflow opening 10A is to be formed, includes the third region PT2a, in which an opening 12XA (part of gate lower opening 12X and shown in FIG. 3E) is to be formed. Second regions PT2c, or tapering resist regions, are formed at both sides of the first region PTab in such a manner that the first region PTab is disposed between the second regions PT2c.

Layout data of patterns of the gate thin portion, the reflow region and the tapering region prepared by, for example, a CAD system is suggested for the gate portion in a mask layout for forming a transistor. The pattern for the gate thin portion may be referred to as a lower electrode pattern or pattern A. The pattern for the reflow region adjacent to pattern A may be referred to as pattern B. The pattern for the tapering region adjacent to pattern B may be referred to as pattern C.

As shown in FIGS. 3B and 3C, the first region PTab of the electron resist layer 5 is exposed to an electron beam at a higher dose than the second regions PT2c adjacent to the first region PTab. The first region PTab and the third region PT2a (shown in FIG. 3D) are selectively removed to form the reflow opening 10A in the electron resist layer 5 by, for example, development. In the present embodiment, the first region PTab and the second region PT2c are substantially simultaneously exposed to an electron beam at different doses. This can reduce the number of process steps. The first region PTab may be referred to as the reflow region. The second region PT2c may be referred to as the tapering resist region.

More specifically, the second regions PT2c and the first region PTab adjoining the inner sides of the second regions PT2c are substantially simultaneously exposed at respective doses: a low dose (for example, about 120 $\mu C/cm^2$) for the second regions PT2c; and a high dose (for example, about 600 $\mu C/cm^2$) for the first region PTab. The second regions PT2c may be exposed to an electron beam using pattern C data, and the first region PTab may be exposed to an electron beam using combined data of pattern A and pattern B.

Then, the first region PTab, which has been exposed at a high dose, is selectively removed to form the reflow opening 10A by, for example, development, as shown in FIG. 3C. Consequently, only the first region PTab including the third region PT2a is removed to form an opening. The second regions PT2c have been exposed to an electron beam, but are not removed.

The high dose for the first region PTab is set for selectively removing the first region PTab. The low dose for the second regions PT2c is set for defining the region to be reflowed. In other words, by exposing the second regions PT2c to an electron beam at a low dose, the second regions PT2c to be reflowed are divided from the other regions.

In order to remove selectively the first region PTab, a low-solubility developer, such as a mixture (MIBK IPA) of methyl isobutyl ketone (MIBK) and isopropanol (IPA), can be used.

Figure 3D:
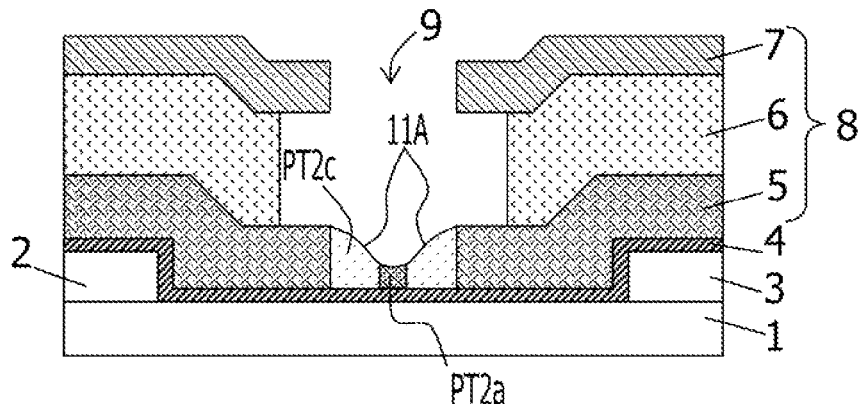

Turning to FIG. 3D, part of the electron resist layer 5, that is, the second regions PT2c (side walls of the electron resist layer 5 exposed in the reflow opening 10A), are heated to reflow. Thus slopes 11A are formed at the side walls of the electron resist layer 5 for forming a tapered portion 13XB (see FIG. 3F) of the gate electrode 13X.

Figure 3E:
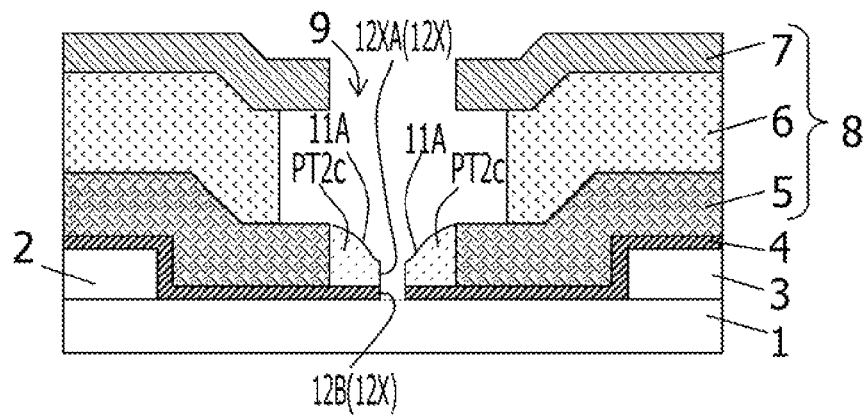

Then, an opening 12XA is formed in the electron resist layer 5 so as to be continued from the slopes 11 formed at the surface of the electron resist layer 5 by reflowing, as shown in FIGS. 3D and 3E.

More specifically, the third region PT2a formed or filled as shown in FIG. 3D by reflowing the second regions PT2c, in which the lower electrode (gate lower portion, gate thin portion, or base) 13XC of the gate electrode 13X is to be formed, is exposed to an electron beam.

Then, the third region PT2a is removed to form an opening 12XA in the electron resist layer 5 by, for example, development, as shown in FIG. 3E. The lower electrode 13XC of the gate electrode 13X may be referred to as the thin gate portion or gate thin portion.

Specifically, the third region PT2a is exposed to an electron beam at a high dose (for example, about 600 $\mu C/cm^2$) and is removed to form the opening 12XA in the electron resist layer 5 by development. The third region PT2a may be exposed to an electron beam using the above-mentioned pattern A data.

Then, an opening 12B is formed in the insulating layer 4, as shown in FIG. 3E, in a similar manner as in the step shown in FIG. 1E of the first embodiment. The opening 12XA in the electron resist layer 5 and the opening 12B in the insulating layer 4 define a gate lower opening (gate thin opening) 12X in which the lower electrode 13XC of the gate electrode 13X is to be formed. Therefore the opening 12XA in the electron resist layer 5 and the opening 12B in the insulating layer 4 may be referred to as the first gate lower opening and the second gate lower opening, respectively.

Thus the thickness of the electron resist layer 5 (second regions PT2c) allows a substantially vertical opening to be formed to a desired height from the bottom of the gate lower opening 12 (the surface of the semiconductor region 1).

Then, the gate electrode 13X is formed in a shape according to the shapes of the opening 9 in the multilayer resist composite 8, the slopes 11A and the gate lower opening 12X, in the same manner as in the step shown in FIG. 1F of the first embodiment.

More specifically, a metal may be vapor-deposited in the opening 9 of the multilayer resist composite 8, including the regions on the slopes 11A and in the gate lower opening 12X, and then the multilayer resist composite 8 is removed. Thus the metal deposited along the shape of the resist layers forms a mushroom-shaped gate electrode 13X.

In the present embodiment, part (second regions PT2c) of the electron resist layer 5 exposed in the reflow opening 10A are heated to reflow, and then the gate lower opening 12X is formed in the electron resist layer 5, as described above.

Consequently, the tapered portion 13XB of the gate electrode 13X can have a gentler inclination than that of known gate electrodes. In addition, a substantially vertical thin gate lower opening 12X can be formed in the electron resist layer 5 as desired without being filled with the reflowed electron resist layer 5.

The other steps of the present method may be similar as in the foregoing first embodiment, and for brevity, the descriptions are omitted.

Figure 3F:
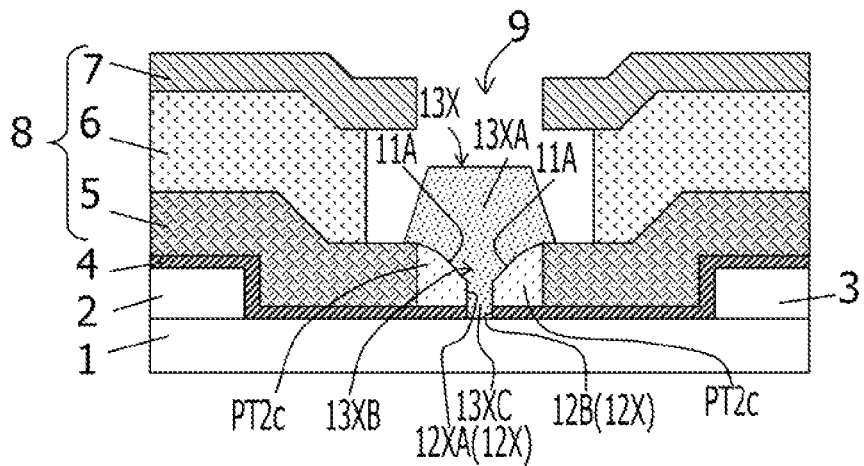

In the structure, the semiconductor device of the present embodiment includes the semiconductor region 1, the gate electrode 13X, the source electrode 2, the drain electrode 3, and the insulating layer 4 covering the surface of the semiconductor region 1, as shown in FIG. 3F.

The gate electrode 13X is disposed over the semiconductor region 1 and includes the upper electrode (gate upper portion) 13XA, the lower electrode (gate lower portion, gate thin portion, or first base) 13XC, and the tapered portion (second base) 13XB between the upper electrode 13XA and the lower electrode 13XC. The gate electrode 13X is in a mushroom shape.

The source electrode 2 and the drain electrode 3 are formed on the semiconductor region 1 with the gate electrode 13X therebetween.

In the present embodiment, the lower electrode 13XC of the gate electrode 13X stands perpendicular to the surface of the semiconductor region 1, and has substantially constant dimensions in the directions parallel to the surface of the semiconductor region 1.

The tapered portion 13XB of the gate electrode 13X is in a forward tapered shape having dimensions parallel to the surface of the semiconductor region 1 gradually increasing in the direction from the lower electrode 13XC to the upper electrode 13XA.

The upper electrode 13XA of the gate electrode 13X rises from the end of the tapered portion 13XB so as to spread over the tapered portion 13XB.

The gate electrode 13X is thus disposed on the semiconductor region 1 with the sides of the lower electrode 13XC in contact with the insulating layer 4. The lower electrode 13XC rises substantially vertically beyond the level of the surface of the insulating layer 4.

The insulating layer 4 is disposed so as to substantially cover the surface of the semiconductor region 1 exposed between the source electrode 2 and the drain electrode 3, that is, between the gate electrode 13X and the source electrode 2 and between the gate electrode 13X and the drain electrode 3. The insulating layer 4 also substantially covers the sides and surfaces of the source electrode 2 and the drain electrode 3.

Preferably, a dimension of the lower electrode 13XC parallel to the surface of the semiconductor region 1 (width L of the lower electrode 13XC) and the length of the tapered portion 13XB perpendicular to the surface of the semiconductor region 1 (height H of the tapered portion 13XB) have an aspect ratio satisfying the relationship $H/L \leq 2.75$. In this instance, the tapered portion 13XB has an inclination of about 70° or less with respect to the direction parallel to the surface of the semiconductor region 1.

If the width L of the lower electrode 13XC is about 100 nm or less, the length of the lower electrode 13XC perpendicular to the surface of the semiconductor region 1 (height H2 of the lower electrode 13XC) and the width L of the lower electrode 13XC preferably have an aspect ratio satisfying the relationship $H2/L \geq 1.0$.

The other structure of the present device may be similar as in the foregoing first embodiment, and for brevity, the description is omitted.

In the semiconductor device and its manufacturing method according to the present embodiment, the tapered portion 13XB of the gate electrode 13X has a gentle inclination. Consequently, the lower electrode 13XC can be formed more thinly while possible breakage of the gate electrode 13X is reduced.

Hence, the resulting gate structure has the tapered portion 13XB having a gentler inclination from the thin lower electrode 13XC to the upper electrode 13XA. Accordingly, cavities are not easily formed in the joint of the lower electrode 13XC and the upper electrode 13XA, and the breakage of the gate electrode 13C can be reduced. Consequently, the yield rate can be increased to reduce the cost.

Furthermore, since the present embodiment can achieve a finer gate structure, high-frequency/high-power characteristics can be enhanced.

Since the thin lower electrode 13XC can be formed substantially vertically to a desired height, the volume of the portion of the gate electrode 13X under the bottom of the upper electrode 13XA (portion defined by the tapered portion 13XB and the lower electrode 13XC) can be reduced to reduce the gate resistance according to the use of the device. For example, the resistance and dimensions of the gate can be reduced in high-frequency/high-power devices, such as a GaN-based HEMT.

A semiconductor device and its manufacturing method according to a third embodiment will now be described with reference to FIGS. 4A to 4F.

Figure 4A:
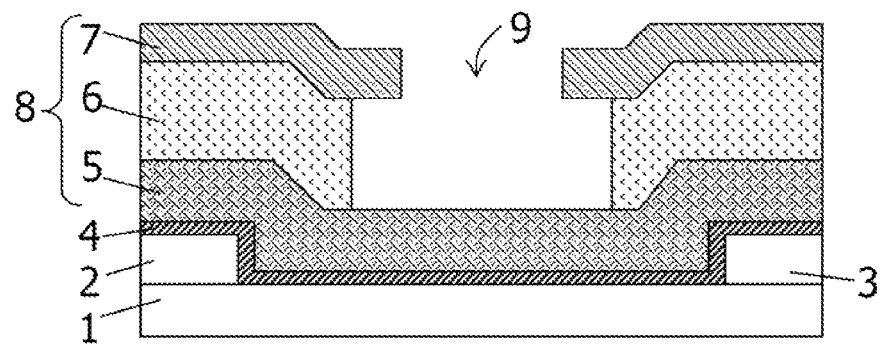
FIGS. 4A to 4F are schematic sectional views showing an exemplary method of manufacturing a semiconductor device and the semiconductor device according to a third embodiment of the present invention.
Figure 4B:
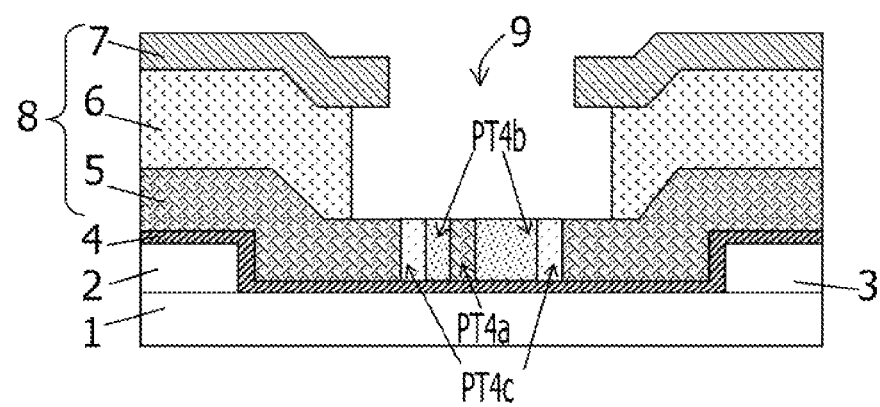
Figure 4C:
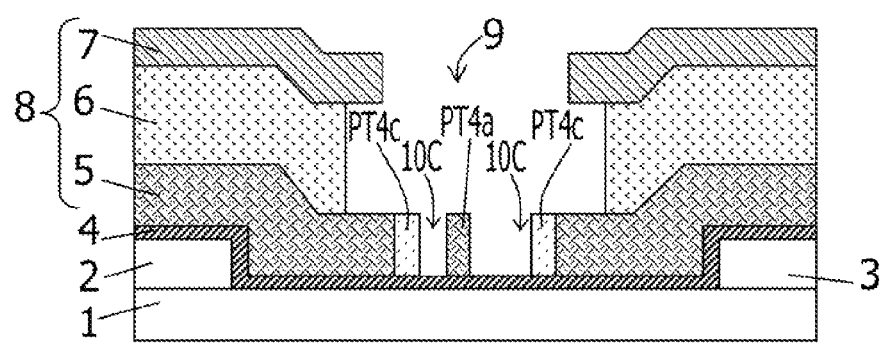
Figure 4D:
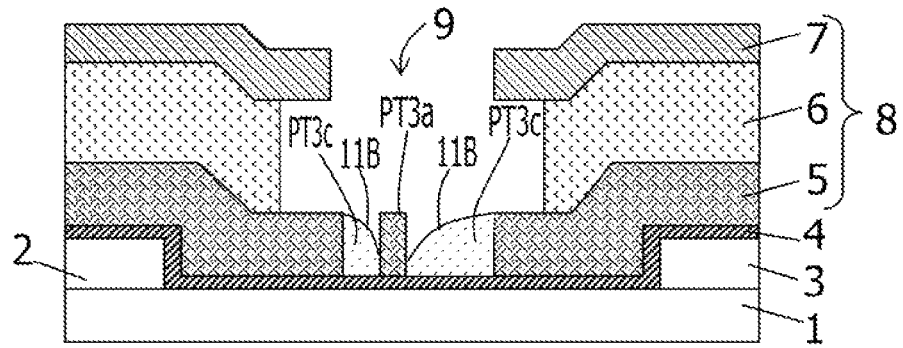
Figure 4E:
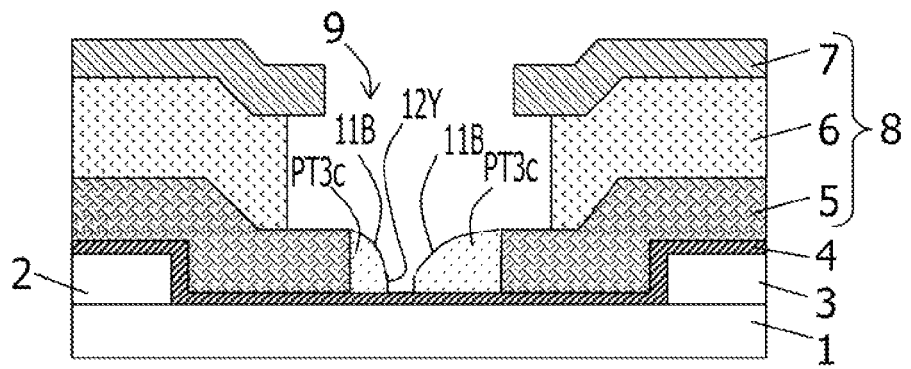
Figure 4F:
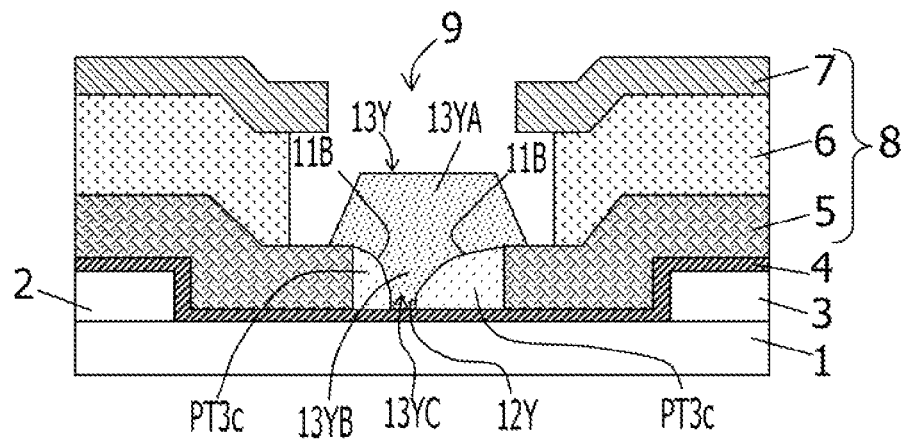

The present embodiment is different from the first embodiment shown in FIGS. 1A to 1F in that the lower electrode 13YC of the gate electrode 13Y is disposed at a position displaced toward the source electrode 2 and that the gate electrode 13Y is disposed on the insulating layer 4, as shown in FIG. 4F. In FIGS. 4A to 4F, the same parts as in the first embodiment shown in FIGS. 1A to 1F are designated by the same reference numerals.

As shown in FIG. 4A, the steps until an opening 9 is formed in resist layers 6 and 7 of the multilayer resist composite 8 other than the lowermost resist layer may be performed in a similar manner as in the first embodiment (see FIG. 1A).

Turning to FIGS. 4B and 4C, reflow openings 10C are formed in the electron resist layer 5 (resist layer in which a lower electrode is to be formed).

In the present embodiment, first regions PT4$b$ of the electron resist layer 5 are formed so that a third region PT4$a$ of the electron resist layer 5 is disposed between the first regions PT4$b$. More specifically, the first regions PT4$b$, in which the reflow openings 10C are to be formed, are formed at two sides of the third region PT4$a$, in which an opening (gate lower opening) 12Y is to be formed, in such a manner that the third region PT4$a$ is disposed between the first regions PT4$b$.

In the present embodiment, the first regions PT4$b$ have different sizes from each other. The first region PT4$b$ at the drain electrode side is larger than the first region PT4$b$ at the source electrode side.

Also, the second regions PT4$c$ are formed at two sides of the first regions PT4$b$ and third region PT4$a$ in such a manner that the first regions PT4$b$ and the third region PT4$a$ are disposed between the second regions PT4$c$.

As shown in FIGS. 4B and 4C, the first regions PT4$b$ of the electron resist layer 5 are exposed to an electron beam at a higher dose than the second regions PT4$c$ adjacent to the first regions PT4$b$. Then, the first regions PT4$b$ are selectively removed to form the reflow openings 10C in the electron resist layer 5 by, for example, development. In the present embodiment, the first regions PT4$b$ and the second regions PT4$c$ are substantially simultaneously exposed to an electron beam at different doses. The first region PT4$b$ may be referred to as the reflow region. The second region PT4$c$ may be referred to as the tapering resist region.

More specifically, the second regions PT4$c$ and the first regions PT4$b$ adjoining the inner sides of the second regions PT4$c$ are simultaneously exposed at respective doses: a low dose (for example, about 120 μC/cm²) for the second regions PT4c; and a high dose (for example, about 600 μC/cm²) for the first regions PT4b, without exposing the third region PT4a.

Then, the first regions PT4b, which have been exposed at a high dose, are selectively removed to form the reflow openings 10C by development, as shown in FIG. 4C. In this instance, only the first regions PT4b are removed to form the openings. The second regions PT4c have been exposed to an electron beam, but are not removed, and the third region PT4a, which has not been exposed, remains.

Turning to FIG. 4D, part of the electron resist layer 5, that is, the second regions PT4c (side walls of the electron resist layer 5 exposed in the reflow openings 10C), are heated to reflow. Thus slopes 11B are formed at the side walls of the electron resist layer 5 for forming a tapered portion 13YB (see FIG. 4F) of the gate electrode 13Y. In the present embodiment, the slopes 11B of the resist layer 5 have different inclinations from each other.

Then, an opening (gate lower opening or first gate lower opening) 12Y is formed in the electron resist layer 5 so as to extend from the slopes 11B formed at the surface of the electron resist layer 5 by reflowing, as shown in FIG. 4E.

In the present embodiment, after the second regions PT4c are reflowed, the third region PT4a, in which the lower electrode (gate lower portion, gate thin portion, or base) 13YC of the gate electrode 13Y is to be formed, is exposed to an electron beam and is then removed by, for example, development. Thus the opening 12Y is formed in the electron resist layer 5. The lower electrode 13YC of the gate electrode 13Y may be referred to as the thin gate portion or gate thin portion.

More specifically, the third region PT4a is exposed to an electron beam at a high dose (for example, about 600 μC/cm²) and is removed to form the opening 12Y in the electron resist layer 5 by development.

Thus the thickness of the electron resist layer 5 (second regions PT4c) allows a substantially vertical opening to be formed to a desired height from the bottom of the gate lower opening 12Y (from the surface of the insulating layer 4).

In the present embodiment, the first regions PT4b are formed in such a manner that the first region PT4b at the drain electrode side is larger than the first region PT4b at the source electrode side, as described above. Hence, the gate lower opening 12Y is disposed at a position displaced toward the source electrode 2. The position of the gate lower opening 12Y in the lowermost electron resist layer 5 of the multilayer resist composite 8 can be thus adjusted.

Turning to FIG. 4F, a gate electrode 13Y is formed in a shape according to the shapes of the opening 9 in the multilayer resist composite 8, the slopes 11B and the gate lower opening 12Y.

More specifically, a metal may be vapor-deposited in the opening 9 of the multilayer resist composite 8, including the regions on the slopes 11B and in the gate lower opening 12X, and then the multilayer resist composite 8 is removed. Thus the metal deposited along the shape of the resist layers forms a mushroom-shaped gate electrode 13Y.

In the present embodiment, the gate lower opening 12Y of the electron resist layer 5 is formed at a position displaced toward the source electrode 2, as described above, and accordingly, the lower electrode 13YC of the gate electrode 13Y is disposed at a position displaced toward the source electrode 2. Thus the position of the lower electrode 13YC of the gate electrode 13Y can be adjusted within the width (length parallel to the surface of the semiconductor region 1) of the top of the tapered portion 13YB.

In the present embodiment, part (second regions PT4c) of the electron resist layer 5 exposed in the reflow openings 10C are heated to reflow, and then the gate lower opening 12Y may be formed in the electron resist layer 5, as described above.

Consequently, the tapered portion 13YB of the gate electrode 13Y can have a relatively gentle inclination. In addition, a substantially vertical thin gate lower opening 12Y can be formed in the electron resist layer 5 as desired without being filled with the reflowed electron resist layer 5.

The other steps of the present method may be similar as in the foregoing first embodiment, and for brevity, the descriptions are omitted.

In the structure, the semiconductor device of the present embodiment includes the semiconductor region 1, the gate electrode 13Y, the source electrode 2, the drain electrode 3, and the insulating layer 4 covering the surface of the semiconductor region 1, as shown in FIG. 4F.

The gate electrode 13Y is disposed over the semiconductor region 1 and includes the upper electrode (gate upper portion) 13YA, the lower electrode (gate lower portion, gate thin portion, or first base) 13YC, and the tapered portion (second base) 13YB between the upper electrode 13YA and the lower electrode 13YC. The gate electrode 13Y is in a mushroom shape.

The source electrode 2 and the drain electrode 3 are formed on the semiconductor region 1 with the gate electrode 13Y therebetween.

In the present embodiment, the lower electrode 13YC of the gate electrode 13Y stands perpendicular to the surface of the semiconductor region 1, and has substantially constant dimensions in the directions parallel to the surface of the semiconductor region 1.

The tapered portion 13YB of the gate electrode 13Y is in a forward tapered shape having dimensions parallel to the surface of the semiconductor region 1 gradually increasing in the direction from the lower electrode 13YC to the upper electrode 13YA.

The upper electrode 13YA of the gate electrode 13Y rises from the end of the tapered portion 13YB so as to spread over the tapered portion 13YB.

The gate electrode 13Y is disposed on the insulating layer 4. Also, the lower electrode 13YC of the gate electrode 13Y is displaced toward the source electrode 2. The lower electrode 13YC of the gate electrode 13Y stands substantially vertically.

The insulating layer 4 is disposed so as to substantially cover the surface of the semiconductor region 1 exposed between the source electrode 2 and the drain electrode 3, that is, between the gate electrode 13Y and the source electrode 2 and between the gate electrode 13Y and the drain electrode 3. The insulating layer 4 also substantially lies between the semiconductor region 1 and the gate electrode 13Y. In addition, the insulating layer 4 substantially covers the sides and surfaces of the source electrode 2 and the drain electrode 3.

Preferably, a dimension of the lower electrode 13YC parallel to the surface of the semiconductor region 1 (width L of the lower electrode 13YC) and the length of the tapered portion 13YB perpendicular to the surface of the semiconductor region 1 (height H of the tapered portion 13YB) have an aspect ratio satisfying the relationship $H/L \leq 2.75$. In this instance, the tapered portion 13YB has an inclination of about 70° or less with respect to the direction parallel to the surface of the semiconductor region 1.

If the width L of the lower electrode 13YC is about 100 nm or less, the length of the lower electrode 13YC perpendicular to the surface of the semiconductor region 1 (height H2 of the lower electrode 13YC) and the width L of the lower electrode 13YC preferably have an aspect ratio satisfying the relationship H2/L≥1.0.

The other structure of the present device may be similar as in the foregoing first embodiment, and for brevity, the description is omitted.

In the semiconductor device and its manufacturing method according to the present embodiment, the tapered portion 13YB of the gate electrode 13Y has a gentle inclination. Consequently, the lower electrode 13YC can be formed more thinly while possible breakage of the gate electrode 13Y is reduced.

Hence, the resulting gate structure has the tapered portion 13YB having a gentler inclination from the thin lower electrode 13YC to the upper electrode 13YA. Accordingly, cavities are not easily formed in the joint of the lower electrode 13YC and the upper electrode 13YA, and the breakage of the gate electrode 13Y can be reduced. Consequently, the yield rate can be increased to reduce the cost.

Furthermore, since the present embodiment can achieve a finer gate structure, high-frequency/high-power characteristics can be enhanced.

Since the thin lower electrode 13YC can be formed substantially vertically to a desired height, the volume of the portion of the gate electrode 13Y under the bottom of the upper electrode 13YA (portion defined by the tapered portion 13YB and the lower electrode 13YC) can be reduced to reduce the gate resistance according to the use of the device. For example, the resistance and dimensions of the gate can be reduced in high-frequency/high-power devices, such as a GaN-based HEMT.

Although the structure of the present embodiment is described as a modification of the first embodiment, the present embodiment may be structured as a modification of the second embodiment.

Although the gate lower opening is not formed in the insulating layer 4 in the present embodiment, the gate lower opening may be formed in the insulating layer 4 as in the first embodiment.

A semiconductor device and its manufacturing method according to a fourth embodiment will now be described with reference to FIGS. 5A to 5F.

Figure 5A:
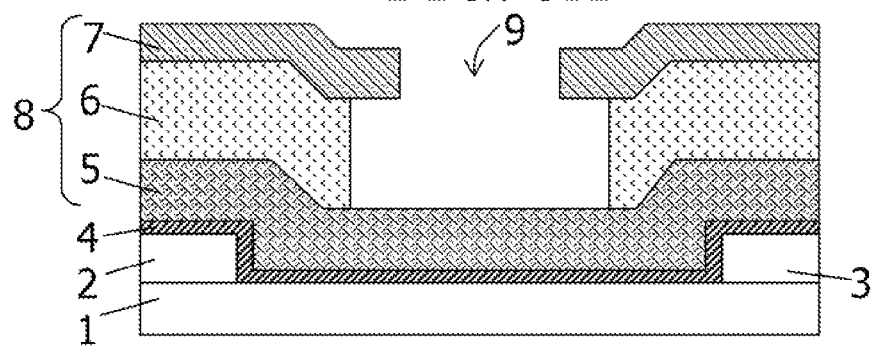
FIGS. 5A to 5F are schematic sectional views showing an exemplary method of manufacturing a semiconductor device and an exemplary semiconductor device according to a fourth embodiment of the present invention.
Figure 5B:
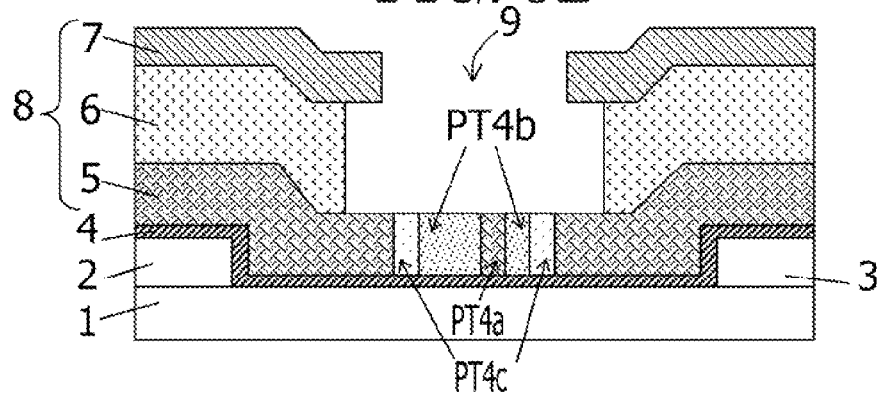
Figure 5C:
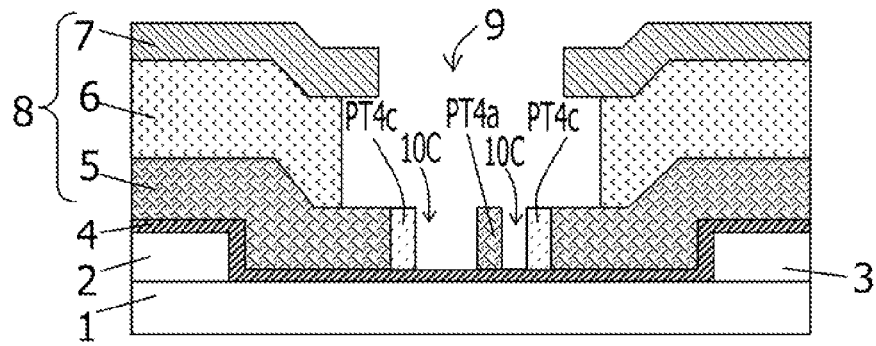
Figure 5D:
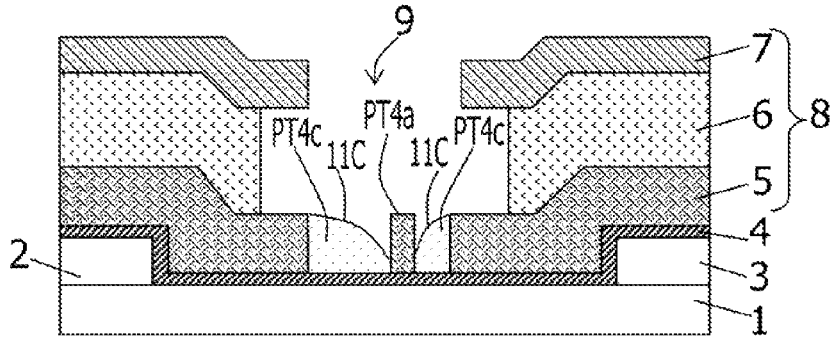
Figure 5E:
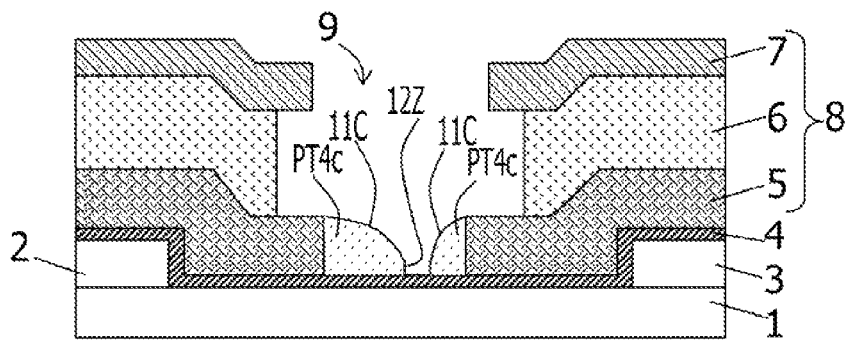
Figure 5F:
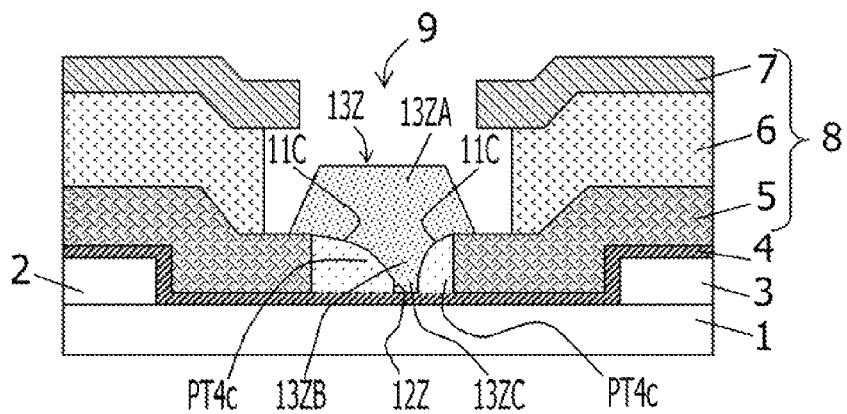

The present embodiment is different from the first embodiment shown in FIGS. 1A to 1F in that the lower electrode 13ZC of the gate electrode 13Z is disposed at a position displaced toward the drain electrode 3 and that the gate electrode 13Z is disposed on the insulating layer 5, as shown in FIG. 5F. In FIGS. 5A to 5F, the same parts as in the first embodiment shown in FIGS. 1A to 1F are designated by the same reference numerals.

As shown in FIG. 5A, the steps until an opening 9 is formed in resist layers 6 and 7 of the multilayer resist composite 8 other than the lowermost resist layer may be performed in a similar manner as in the first embodiment (see FIG. 1A).

Turning to FIGS. 5B and 5C, reflow openings 10C are formed in the lowermost electron resist layer 5 (resist layer in which a lower electrode is to be formed).

In the present embodiment, first regions PT4b of the electron resist layer 5 are formed so that a third region PT4a of the electron resist layer 5 is disposed between the first regions PT4b. More specifically, the first region PT4b, in which the reflow openings 10C are to be formed, are formed at two sides of the third region PT4a, in which an opening (gate lower opening) 12Z is to be formed, in such a manner that the third region PT4a is disposed between the first regions PT4b.

In the present embodiment, the first regions PT4b have different sizes from each other. The first region PT4b at the source electrode side is larger than the first region PT4b at the drain electrode side.

Also, the second regions PT4c are formed at two sides of the first regions PT4b and third region PT4a in such a manner that the first regions PT4b and the third region PT4a are disposed between the second regions PT4c.

As shown in FIGS. 5B and 5C, the first regions PT4b of the electron resist layer 5 are exposed to an electron beam at a higher dose than the second regions PT4c adjacent to the first regions PT4b. Then, the first regions PT4b are selectively removed to form the reflow openings 10C in the electron resist layer 5 by, for example development. In the present embodiment, the first regions PT4b and the second regions PT4c are substantially simultaneously exposed to an electron beam at different doses. The first region PT4b may be referred to as the reflow region. The second region PT4c may be referred to as the tapering resist region.

More specifically, the second regions PT4c and the first regions PT4b adjoining the inner sides of the second regions PT4c are substantially simultaneously exposed at respective doses: a low dose (for example, about 120 $\mu C/cm^2$) for the second regions PT4c; and a high dose (for example, about 600 $\mu C/cm^2$) for the first regions PT4b, without exposing the third region PT4a.

Then, the first regions PT4b, which have been exposed at a high dose, are selectively removed to form the reflow openings 10C by, for example, development, as shown in FIG. 5C. In this instance, only the first regions PT4b are removed to form the openings. The second regions PT4c have been exposed to an electron beam, but are not removed, and the third region PT4a, which has not been exposed, remains.

Turning to FIG. 5D, part of the electron resist layer 5, that is, the second regions PT4c (side walls of the electron resist layer 5 exposed in the reflow openings 10C), are heated to reflow. Thus slopes 11C are formed at the side walls of the electron resist layer 5 for forming a tapered portion 13ZB (see FIG. 5F) of the gate electrode 13Z. In the present embodiment, the slopes 11C of the resist layer 5 have different inclinations from each other.

Then, an opening (gate lower opening or first gate lower opening) 12Z is formed in the electron resist layer 5 so as to extend from the slopes 11C formed at the surface of the electron resist layer 5 by reflowing, as shown in FIG. 5E.

In the present embodiment, after the second regions PT4c are reflowed, the third region PT4a, in which the lower electrode (gate lower portion, gate thin portion, or base) 13ZC of the gate electrode 13Z is to be formed, is exposed to an electron beam and is then removed by, for example, development. Thus the opening 12Z is formed in the electron resist layer 5. The lower electrode 13ZC of the gate electrode 13Z may be referred to as the thin gate portion or gate thin portion.

More specifically, the third region PT4a is exposed to an electron beam at a high dose (for example, about 600 $\mu C/cm^2$) and is removed to form the opening 12Z in the electron resist layer 5 by development.

Thus the thickness of the electron resist layer 5 (second regions PT4c) allows a substantially vertical opening to be formed to a desired height from the bottom of the gate lower opening 12Z (from the surface of the insulating layer 4).

In the present embodiment, the first regions PT4b are formed in such a manner that the first region PT4b at the source electrode side is larger than the first region PT4b at the drain electrode side, as described above. Hence, the gate lower opening 12Z is disposed at a position displaced toward the drain electrode 3. The position of the gate lower opening 12Z in the lowermost electron resist layer 5 of the multilayer resist composite 8 can be thus adjusted.

Then, the gate electrode 13Z is formed in a shape according to the shapes of the opening 9 in the multilayer resist composite 8, the slopes 11C and the gate lower opening 12Z, as shown in FIG. 5F.

More specifically, a metal may be vapor-deposited in the opening 9 of the multilayer resist composite 8, including the regions on the slopes 11C and in the gate lower opening 12Z, and then the multilayer resist composite 8 is removed. Thus the metal deposited along the shape of the resist layers forms a mushroom-shaped gate electrode 13Z.

In the present embodiment, the gate lower opening 12Z of the electron resist layer 5 is formed at a position displaced toward the drain electrode 3, as described above, and accordingly, the lower electrode 13ZC of the gate electrode 13Z is disposed at a position displaced toward the drain electrode 3. Thus the position of the lower electrode 13ZC of the gate electrode 13Z can be adjusted within the width (length parallel to the surface of the semiconductor region 1) of the top of the tapered portion 13ZB.

In the present embodiment, part (second regions PT4c) of the electron resist layer 5 exposed in the reflow openings 10C are heated to reflow, and then the gate lower opening 12Z is formed in the electron resist layer 5, as described above.

Consequently, the tapered portion 13ZB of the gate electrode 13Z can have a relatively gentle inclination. In addition, a substantially vertical thin gate lower opening 12Z can be formed in the electron resist layer 5 as desired without being filled with the reflowed electron resist layer 5.

The other steps of the present method may be similar as in the foregoing first embodiment, and for brevity, the descriptions are omitted.

In the structure, the semiconductor device of the present embodiment includes the semiconductor region 1, the gate electrode 13Z, the source electrode 2, the drain electrode 3, and the insulating layer 4 substantially covering the surface of the semiconductor region 1, as shown in FIG. 5F.

The gate electrode 13Z is disposed over the semiconductor region 1 and includes the upper electrode (gate upper portion) 13ZA, the lower electrode (gate lower portion, gate thin portion, or first base) 13ZC, and the tapered portion (second base) 13ZB between the upper electrode 13ZA and the lower electrode 13ZC. The gate electrode 13Z is in a mushroom shape.

The source electrode 2 and the drain electrode 3 are formed on the semiconductor region 1 with the gate electrode 13Z therebetween.

In the present embodiment, the lower electrode 13ZC of the gate electrode 13Z stands perpendicular to the surface of the semiconductor region 1, and has substantially constant dimensions in the directions parallel to the surface of the semiconductor region 1.

The tapered portion 13ZB of the gate electrode 13Z is in a forward tapered shape having dimensions parallel to the surface of the semiconductor region 1 gradually increasing in the direction from the lower electrode 13ZC to the upper electrode 13ZA.

The upper electrode 13ZA of the gate electrode 13Z rises from the end of the tapered portion 13ZB so as to spread over the tapered portion 13ZB.

The gate electrode 13Z is disposed on the insulating layer 4. Also, the lower electrode 13ZC of the gate electrode 13Z is displaced toward the drain electrode 3. The lower electrode 13ZC of the gate electrode 13Z stands substantially vertically.

The insulating layer 4 is disposed so as to substantially cover the surface of the semiconductor region 1 exposed between the source electrode 2 and the drain electrode 3, that is, between the gate electrode 13Z and the source electrode 2 and between the gate electrode 13Z and the drain electrode 3. The insulating layer 4 also substantially lies between the semiconductor region 1 and the gate electrode 13Z. In addition, the insulating layer 4 substantially covers the sides and surfaces of the source electrode 2 and the drain electrode 3.

Preferably, a dimension of the lower electrode 13ZC parallel to the surface of the semiconductor region 1 (width L of the lower electrode 13ZC) and the length of the tapered portion 13ZB perpendicular to the surface of the semiconductor region 1 (height H of the tapered portion 13ZB) have an aspect ratio satisfying the relationship H/L≤2.75. In this instance, the tapered portion 13ZB has an inclination of about 70° or less with respect to the direction parallel to the surface of the semiconductor region 1.

If the width L of the lower electrode 13ZC is about 100 nm or less, the length of the lower electrode 13ZC perpendicular to the surface of the semiconductor region 1 (height H2 of the lower electrode 13ZC) and the width L of the lower electrode 13ZC preferably have an aspect ratio satisfying the relationship H2/L≥1.0.

The other structure of the present device may be similar as in the foregoing first embodiment, and for brevity, the description is omitted.

In the semiconductor device and its manufacturing method according to the present embodiment, the tapered portion 13ZB of the gate electrode 13Z has a gentle inclination. Consequently, the lower electrode 13ZC can be formed more thinly while possible breakage of the gate electrode 13Z is reduced.

Hence, the resulting gate structure has the tapered portion 13ZB having a gentler inclination from the thin lower electrode 13ZC to the upper electrode 13ZA. Accordingly, cavities are not easily formed in the joint of the lower electrode 13ZC and the upper electrode 13ZA, and the breakage of the gate electrode 13Z can be reduced. Consequently, the yield rate can be increased to reduce the cost.

Furthermore, since the present embodiment can achieve a finer gate structure, high-frequency/high-power characteristics can be enhanced.

Since the thin lower electrode 13ZC can be formed substantially vertically to a desired height, the volume of the portion of the gate electrode 13Z under the bottom of the upper electrode 13ZA (portion defined by the tapered portion 13ZB and the lower electrode 13ZC) can be reduced to reduce the gate resistance according to the use of the device. For example, the resistance and dimensions of the gate can be reduced in high-frequency/high-power devices, such as a GaN-based HEMT.

Although the structure of the present embodiment is described as a modification of the first embodiment, the present embodiment may be structured as a modification of the second embodiment.

Although the gate lower opening is not formed in the insulating layer 4 in the present embodiment, the gate lower opening may be formed in the insulating layer 4 as in the first embodiment.

Although the present invention has been described with reference to the above embodiments, it is not limited to those embodiments, and various modifications may be made without departing from the spirit of the present invention.

Figure 6:
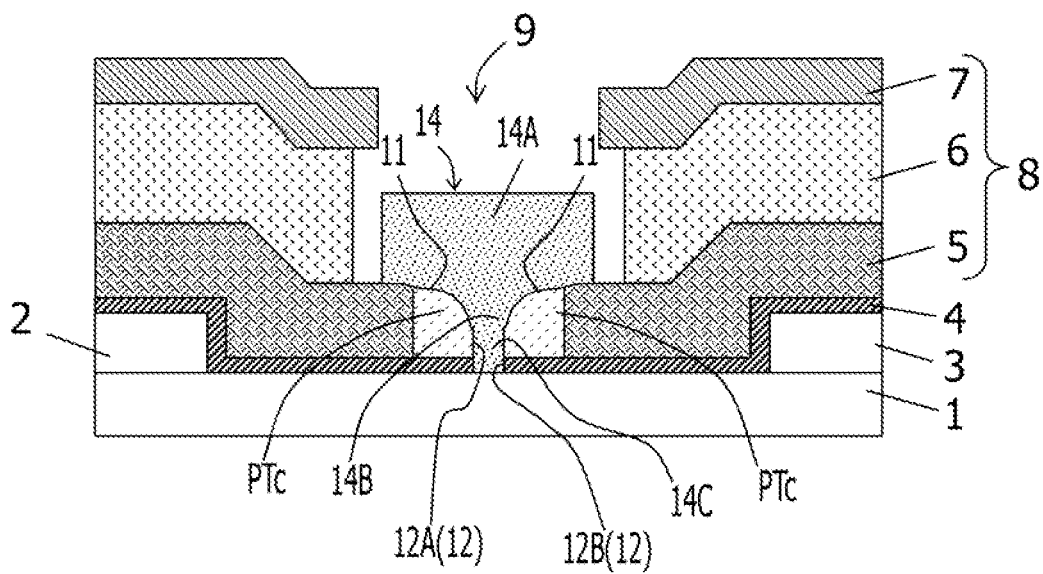
FIG. 6 is a schematic sectional view of an exemplary semiconductor device according to a modification of the disclosed embodiments.

For example, although the gate electrode in the above embodiments is in a mushroom shape, it is not particularly limited to this shape, and the gate electrode may be in a T shape including, for example, an upper electrode 14A, a tapered portion 14B and a lower electrode 14C, as shown in FIG. 6. In FIG. 6, the same parts as in the first to fourth embodiments shown in FIGS. 1F, 3F, 4F and 5F are designated by the same reference numerals.

Figure 7A:
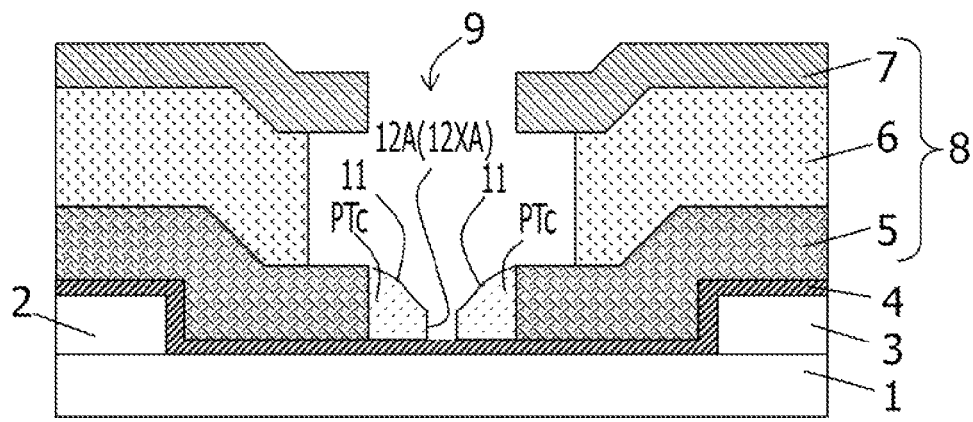
FIGS. 7A and 7B are schematic sectional views showing an exemplary method of manufacturing a semiconductor device and an exemplary semiconductor device according to another modification of the embodiments.
Figure 7B:
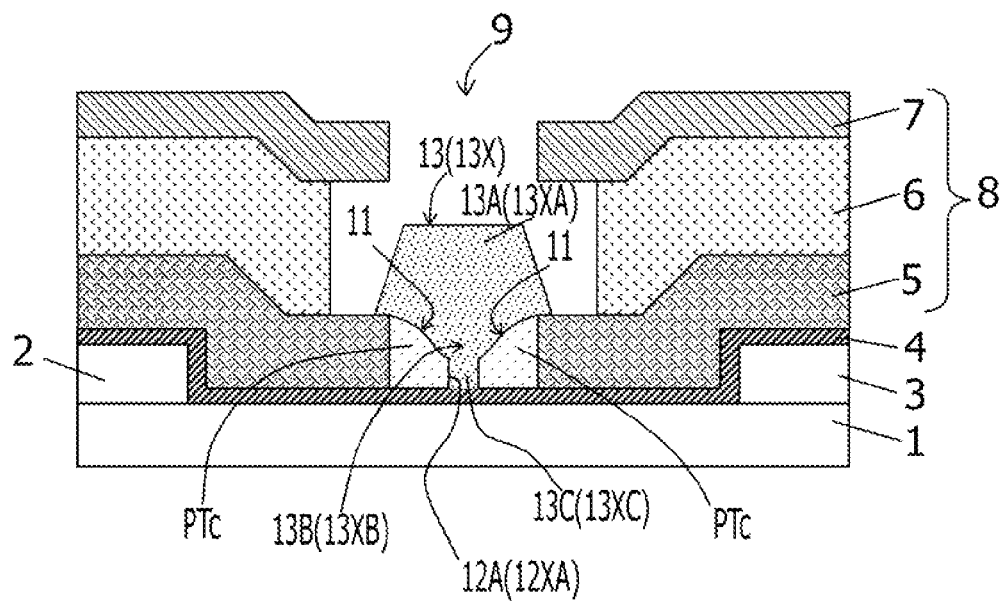

Although in the first and the second embodiment, the second gate lower opening 12B is formed in the insulating layer 4, the gate lower opening need not be formed in the insulating layer 4, as shown in FIGS. 7A and 7B. In this instance, after an opening (first gate lower opening) 12A or 12XA is formed in the electron resist layer 5, as shown in FIG. 7A, the gate electrode 13 or 13X is formed, as shown in FIG. 7B. Hence, the gate electrode 13 or 13X is disposed on the insulating layer 4. Consequently, the insulating layer 4 lies not only on the surface of the semiconductor region 1 between the gate electrode 13 or 13X and the source electrode 2 and between the gate electrode 13 or 13X and the drain electrode 3, but also between the semiconductor region 1 and the gate electrode 13 or 13X. In FIGS. 7A and 7B, the same parts as in the first embodiment shown in FIGS. 1E and 1F and the second embodiment shown in FIGS. 3E and 3F are designated by the same reference numerals.

Figure 8A:
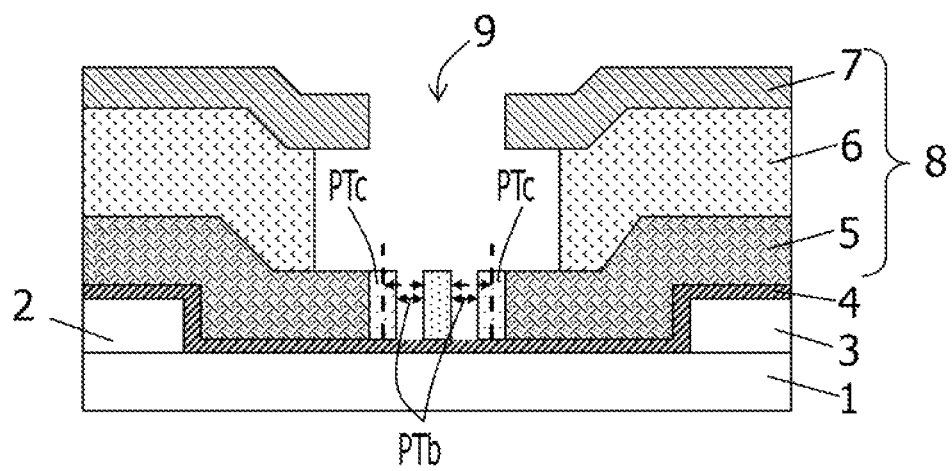
FIGS. 8A to 8D are schematic sectional views showing an exemplary method of manufacturing a semiconductor device and the semiconductor device according to another aspect of the embodiments.
Figure 8B:
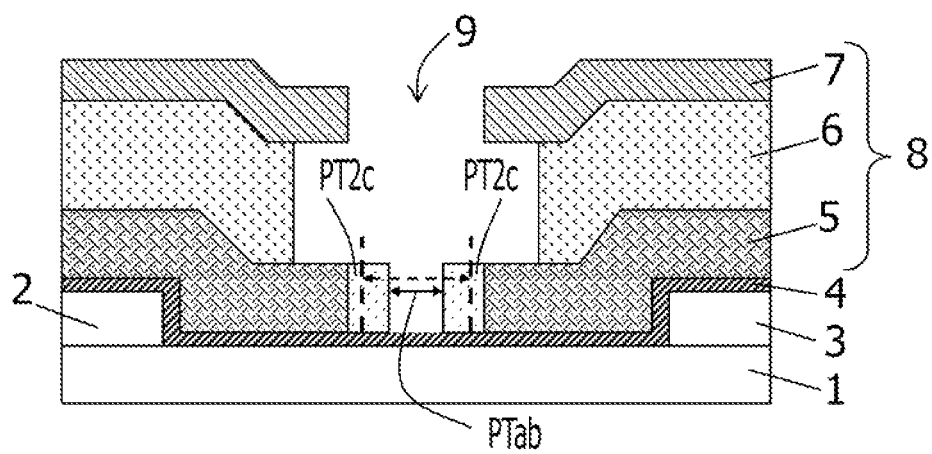

In the first and the second embodiment, the area or width of the first region PTb or PTab or the second region PTc or PT2c in the lowermost resist layer 5 (electron resist layer) of the multilayer resist composite 8 may be varied, as shown in FIGS. 8A and 8B. In FIGS. 8A and 8B, the same parts as in the first embodiment shown in FIG. 1C and the second embodiment shown in FIG. 3C are designated by the same reference numerals.

Figure 8C:
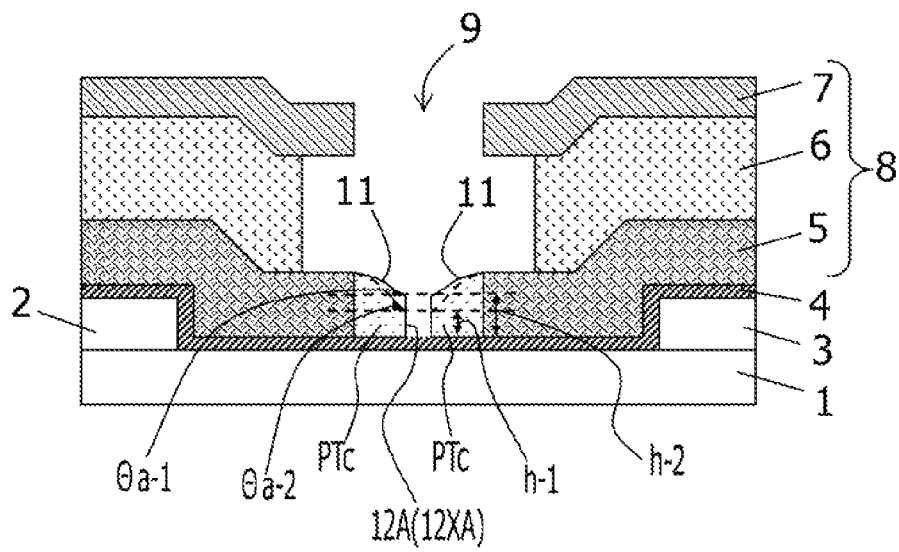
Figure 8D:
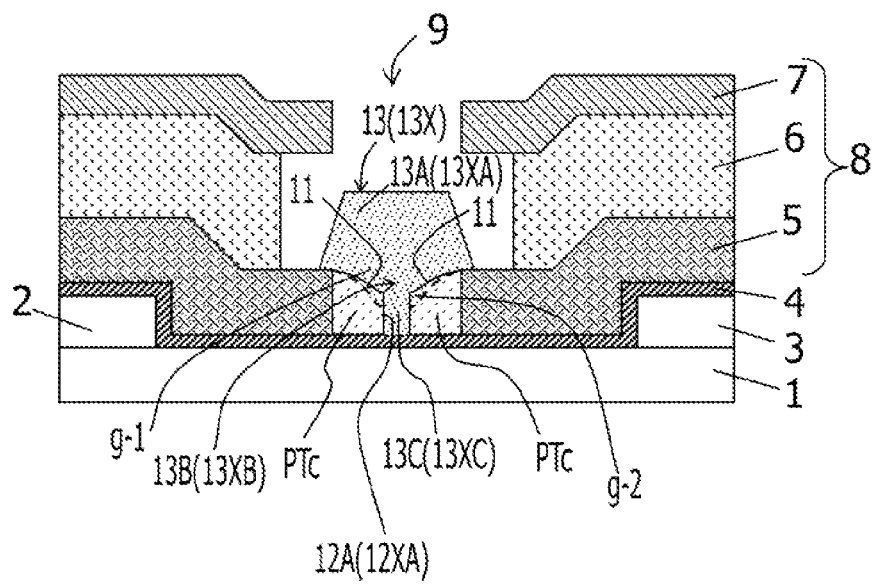

More specifically, by increasing or reducing the area of the first region PTb or PTab, as indicated by solid lines and dotted lines in FIG. 8A or 8B, the height (h-1, h-2) of the gate lower opening 12A or 12XA formed in the lowermost resist layer 5 can be arbitrarily varied, as indicated by solid lines and dotted lines in FIG. 8C. Thus, the height of the lower electrode 13C or 13XC of the gate electrode 13 or 13X from the surface of the semiconductor region 1 or the surface of the insulating layer 4, that is, the length from the surface of the semiconductor region 1 or the surface of the insulating layer 4 to the lower end of the tapered portion 13B or 13XB, can be arbitrarily varied, as shown in FIG. 8D. In FIGS. 8C and 8D, the same parts as in the first embodiment shown in FIGS. 1D and 1E and the second embodiment shown in FIGS. 3D and 3E are designated by the same reference numerals.

In addition, by increasing or reducing the area or width of the second region PTc (PT2c), as shown in FIGS. 8A and 8B, the height of the lower electrode 13C or 13XC of the gate electrode 13 or 13X can be varied, as shown in FIG. 8D. Hence, by adjusting the amount of resist in the second region PTc (PT2c), as shown in FIGS. 8A and 8B, the height of the lower electrode 13C (13XC) of the gate electrode 13 (13X) can be varied, as shown in FIG. 8D.

Furthermore, by increasing or reducing the area or width of the first region PTb or PTab, as shown in FIGS. 8A and 8B, the inclination (θa-1, θa-2) of the slopes 11 at the surfaces (side walls) of the lowermost resist layer 5 can be arbitrarily varied sharply or gently, as indicated by solid lines and dotted lines in FIG. 8C. Thus, the inclination of the tapered portion 13B or 13XB of the gate electrode 13 or 13X can be arbitrarily varied sharply or gently, as indicated by solid lines and dotted lines in FIG. 8D.

Also, by increasing or reducing the width of the second region PTc or PT2c, as shown in FIGS. 8A and 8B, the inclination of the tapered portion 13B or 13XB of the gate electrode 13 or 13X can be varied, as indicated by solid lines and dotted lines in FIG. 8D. Hence, by adjusting the amount of resist in the second region PTc or PT2c, as shown in FIGS. 8A and 8B, the inclination of the tapered portion 13B or 13XB of the gate electrode 13 or 13X can be varied, as indicated by solid lines and dotted lined in FIG. 8D.

Figure 9:
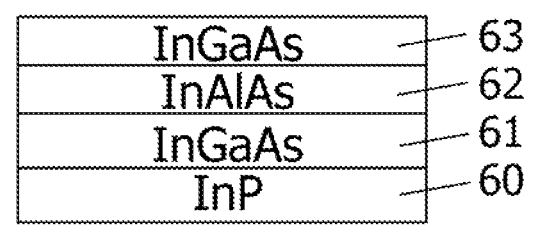

Although the present invention is applied to a GaN-based HEMT in the disclosed embodiments, these embodiments do not limit the scope of the invention, and the invention may be applied to, for example, an InP-based HEMT (field effect transistor). In this instance, as shown in FIG. 9, an InP substrate 60 may be used as the semiconductor substrate (compound semiconductor substrate), and the semiconductor region (compound semiconductor region) 1 may have a multilayer structure including an InGaAs layer 61, an InAlAs layer 62, and an InGaAs layer 63.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present inventions have been described in detail, it should be understood that various changes, substitutions, and alterations could be made hereto without departing from the spirit and scope of the invention.

What is claimed is:

1. A semiconductor device comprising:
a semiconductor region;
a gate electrode disposed over the semiconductor region, including a first electrode portion, a second electrode portion standing substantially perpendicular to a surface of the semiconductor region and having a substantially constant dimension in a direction parallel to the surface of the semiconductor region, and a tapered portion disposed between the first electrode portion and the second electrode portion and having a dimension parallel to the surface of the semiconductor region increasing in the direction from the second electrode portion to the first electrode portion;
a source and a drain electrode at both sides of the gate electrode over the semiconductor region; and
an insulating layer covering at least a portion of the surface of the semiconductor region,
wherein the second electrode portion of the gate electrode is disposed at a position closer to one of the drain electrode and the source electrode.

2. The semiconductor device according to claim 1, wherein a dimension L of the second electrode portion parallel to the surface of the semiconductor region and a height H of the tapered portion perpendicular to the surface of the semiconductor region have an aspect ratio satisfying a relationship $H/L \leq 2.75$.

3. The semiconductor device according to claim 2, wherein the tapered portion has an inclination of about 70° or less with respect to a direction parallel to the surface of the semiconductor region.

4. The semiconductor device according to claim 1, wherein when a dimension L of the second electrode portion parallel to the surface of the semiconductor region is 100 nm or less, the first electrode portion has an aspect ratio satisfying the relationship $H2/L \geq 1.0$, wherein H2 represents the height of the second electrode portion perpendicular to the surface of the semiconductor region.

5. The semiconductor device according to claim 1, wherein the gate electrode is in a T shape or a mushroom shape.

6. The semiconductor device according to claim 1, wherein the gate electrode is disposed on the semiconductor region and the side surfaces of the second electrode portion are in contact with the insulating layer.

7. The semiconductor device according to claim 1, wherein the gate electrode is disposed on the insulating layer.

8. The semiconductor device according to claim 1, wherein the insulating layer is made of a material selected from the group consisting of oxides, nitrides, and High-k dielectrics.

9. The semiconductor device according to claim 1, wherein the insulating layer is made of a material selected from the group consisting of $SiO_2$, SiN, HfSiO, HfAlON, $HfO_2$, and $Y_2O_3$.

* * * * *